(12) United States Patent
Nakamura et al.

(10) Patent No.: US 11,189,549 B2
(45) Date of Patent: Nov. 30, 2021

(54) SEMICONDUCTOR DEVICE AND METHOD FOR MANUFACTURING THE SAME

(71) Applicant: PANASONIC INTELLECTUAL PROPERTY MANAGEMENT CO., LTD., Osaka (JP)

(72) Inventors: Hidekazu Nakamura, Osaka (JP); Manabu Yanagihara, Osaka (JP); Tomohiko Nakamura, Osaka (JP); Yusuke Katagiri, Kyoto (JP); Katsumi Otani, Osaka (JP); Takeshi Kawabata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 135 days.

(21) Appl. No.: 16/363,828

(22) Filed: Mar. 25, 2019

(65) Prior Publication Data

US 2019/0221503 A1 Jul. 18, 2019

Related U.S. Application Data

(63) Continuation of application No. PCT/JP2017/032453, filed on Sep. 8, 2017.

(30) Foreign Application Priority Data

Sep. 27, 2016 (JP) .............................. JP2016-188885

(51) Int. Cl.
*H01L 23/495* (2006.01)
*H01L 29/20* (2006.01)
(Continued)

(52) U.S. Cl.
CPC ........ *H01L 23/49513* (2013.01); *H01L 21/52* (2013.01); *H01L 23/48* (2013.01);
(Continued)

(58) Field of Classification Search
CPC ...................... H01L 23/49513; H01L 29/2003
See application file for complete search history.

(56) References Cited

U.S. PATENT DOCUMENTS

| 2005/0145883 A1* | 7/2005 | Beach ............... H01L 29/66462 257/194 |
| 2009/0057855 A1* | 3/2009 | Quinones .......... H01L 23/49575 257/676 |

(Continued)

FOREIGN PATENT DOCUMENTS

| JP | 2003-318344 A | 11/2003 |
| JP | 2006-140265 A | 6/2006 |

(Continued)

OTHER PUBLICATIONS

International Search Report and Written Opinion dated Oct. 10, 2017 in International Application No. PCT/JP2017/032453; with partial English translation.

*Primary Examiner* — Alia Sabur
(74) *Attorney, Agent, or Firm* — McDermott Will and Emery LLP

(57) ABSTRACT

A semiconductor device that is a surface mount-type device includes a nitride semiconductor chip including a silicon substrate having a first thermal expansion coefficient and an $In_xGa_yAl_{1-x-y}N$ layer in contact with a surface of the silicon substrate, where $0 \le x \le 1$, $0 \le y \le 1$, $0 \le x+y \le 1$; and a die pad including Cu and having a second thermal expansion coefficient that is greater than the first thermal expansion coefficient. A thickness of the nitride semiconductor chip is at least 0.2 mm, length L of the nitride semiconductor chip is at least 3.12 mm, and thickness tm of the die pad and length L of the nitride semiconductor chip satisfy $tm \ge 2.00 \times 10^{-3} \times L^2 + 0.173$, tm being a thickness in mm and L being a length in mm.

17 Claims, 18 Drawing Sheets

(51) Int. Cl.
*H01L 23/00* (2006.01)
*H01L 25/07* (2006.01)
*H01L 25/18* (2006.01)
*H01L 21/52* (2006.01)
*H01L 23/48* (2006.01)
*H01L 23/31* (2006.01)

(52) U.S. Cl.
CPC .... *H01L 23/4952* (2013.01); *H01L 23/49541* (2013.01); *H01L 23/49562* (2013.01); *H01L 24/32* (2013.01); *H01L 24/48* (2013.01); *H01L 24/73* (2013.01); *H01L 25/07* (2013.01); *H01L 25/18* (2013.01); *H01L 29/2003* (2013.01); *H01L 23/3107* (2013.01); *H01L 23/562* (2013.01); *H01L 24/45* (2013.01); *H01L 2224/0603* (2013.01); *H01L 2224/29116* (2013.01); *H01L 2224/32245* (2013.01); *H01L 2224/45124* (2013.01); *H01L 2224/45144* (2013.01); *H01L 2224/45147* (2013.01); *H01L 2224/48091* (2013.01); *H01L 2224/48247* (2013.01); *H01L 2224/49109* (2013.01); *H01L 2224/49111* (2013.01); *H01L 2224/73265* (2013.01); *H01L 2924/014* (2013.01); *H01L 2924/181* (2013.01); *H01L 2924/3511* (2013.01)

(56) References Cited

U.S. PATENT DOCUMENTS

| | | | |
|---|---|---|---|
| 2012/0292087 A1* | 11/2012 | Ueshima | H01L 23/49513 174/259 |
| 2013/0049231 A1* | 2/2013 | Miyoshi | H01L 24/49 257/782 |
| 2016/0005680 A1* | 1/2016 | Israel | H01L 23/49568 257/675 |
| 2016/0276251 A1* | 9/2016 | Mustanir | H01L 24/97 |

FOREIGN PATENT DOCUMENTS

| | | |
|---|---|---|
| JP | 2008-034514 A | 2/2008 |
| JP | 2008-103558 A | 5/2008 |
| JP | 2008-104348 A | 5/2008 |
| WO | 2015/079808 A1 | 6/2015 |
| WO | 2015/079834 A1 | 6/2015 |

* cited by examiner

SEMICONDUCTOR DEVICE AND METHOD FOR MANUFACTURING THE SAME

CROSS REFERENCE TO RELATED APPLICATIONS

This application is a U.S. continuation application of PCT International Patent Application Number PCT/JP2017/032453 filed on Sep. 8, 2017, claiming the benefit of priority of Japanese Patent Application Number 2016-188885 filed on Sep. 27, 2016, the entire contents of which are hereby incorporated by reference.

BACKGROUND

1. Technical Field

The present disclosure relates to a nitride semiconductor device, a semiconductor device housing a nitride semiconductor chip having an $In_xGa_yAl_{1-x-y}N$ layer formed on a surface of a silicon substrate, and a method for manufacturing the semiconductor device.

2. Description of the Related Art

III-V nitride compound semiconductors, typically represented by gallium nitride (GaN), or so-called nitride semiconductors have been gaining traction in recent years.

FIG. 17 is a diagram schematically showing a cross-section structure of the nitride semiconductor device mentioned in Patent Literature (PTL) 1 (Japanese Unexamined Patent Application Publication No. 2008-103558). As illustrated in the drawing, the nitride semiconductor device mentioned in PTL 1 includes III-nitride semiconductor element 161 including a III-nitride semiconductor deposited on a sapphire substrate at least 300 μm thick, heat sink 162 on which III-nitride semiconductor element 161 is mounted, and solder 163 with a melting point of at least 300° C. that joins heat sink 162 and III-nitride semiconductor element 161. This configuration limits an occurrence of cracks in III-nitride semiconductor element 161. These cracks are caused by (i) a temperature difference between when the solder is applied to join heat sink 162 and III-nitride semiconductor element 161, and afterwards when the solder cools down, (ii) a difference in the rate of thermal expansion between heat sink 162 and III-nitride semiconductor element 161, and (iii) tension caused thereby.

SUMMARY

PTL 1 attempts to limit the occurrence of cracks in the sapphire substrate-based nitride semiconductor chip. There is, however, still a risk of cracks occurring in the nitride semiconductor chip of the semiconductor device including the silicon substrate-based nitride semiconductor chip.

The present disclosure provides a semiconductor device that limits the occurrence of cracks in the silicon substrate-based nitride semiconductor chip, and a manufacturing method thereof.

In order to solve the above problem, a semiconductor device that is a surface mount-type device according to an aspect of the present disclosure includes a nitride semiconductor chip including a silicon substrate having a first thermal expansion coefficient and an $In_xGa_yAl_{1-x-y}N$ layer in contact with a surface of the silicon substrate, where $0 \le x \le 1$, $0 \le y \le 1$, $0 \le x+y \le 1$; a die pad including Cu and having a second thermal expansion coefficient that is greater than the first thermal expansion coefficient; and an adhesive that joins a backside of the nitride semiconductor chip and the die pad. A thickness of the nitride semiconductor chip is at least 0.2 mm, length L of the nitride semiconductor chip is at least 3.12 mm and thickness tm of the die pad and length L of the nitride semiconductor chip satisfy $tm \ge 2.00 \times 10^{-3} \times L^2 + 0.173$, tm being a thickness in mm and L being a length in mm.

A method for manufacturing a semiconductor device including (i) a nitride semiconductor chip having a thickness of at least 0.2 mm and including a silicon substrate having a first thermal expansion coefficient and an $In_xGa_yAl_{1-x-y}N$ layer in contact with a surface of the silicon substrate, where $0 \le x \le 1$, $0 \le y \le 1$, $0 \le x+y \le 1$, and (ii) a die pad including Cu and having a second thermal expansion coefficient that is greater than the first thermal expansion coefficient, and (iii) an adhesive that joins a backside of the nitride semiconductor chip and the die pad according to an aspect of the present disclosure includes determining a size of one of length L of the nitride semiconductor chip and thickness tm of the die pad, L being a length in mm and tm being a thickness in mm; and determining a size of the other of length L and thickness tm that satisfies $tm \ge 2.00 \times 10^{-3} \times L^2 + 0.173$, L being at least 3.12 mm.

The present disclosure makes it possible to limit the occurrence of cracks in the nitride semiconductor chip.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Underlying Knowledge Forming Basis of Present Disclosure

The inventors have identified the following problem related to the semiconductor device mentioned in the section "Background."

Nitride semiconductors are generally represented by $In_xGa_yAl_{1-x-y}N$ ($0 \leq x \leq 1$, $0 \leq y \leq 1$, $0 \leq x+y \leq 1$), and are compound semiconductors made of the group III elements aluminum (Al), gallium (Ga), and indium (In), and the group V element nitride (N).

Nitride semiconductors are generally epitaxially grown through metal organic chemical vapor deposition (MOCVD) on a substrate, e.g. a silicon carbide, sapphire, or silicon substrate.

Especially in recent years have expectations been high of power devices including a nitride semiconductor of which one chip carries a high amount of current of at least 50 amperes for use in power supplies of servers, base stations, for use in cars, and the like.

Accordingly, nitride semiconductor chips have become larger, and nitride semiconductor chips with a length of over 3 mm have become necessary lately.

Packages housing the nitride semiconductor chips are in demand to lower inductance, and mounting with surface mount packages that can reduce parasitic inductance is advancing.

Large deformations occur in nitride semiconductor devices with a large nitride semiconductor chip and a surface mount package due to a difference between the thermal expansion coefficients of the nitride semiconductor, the silicon substrate, and the surface mount package die pad. The nitride semiconductor chip, therefore, warps which leads to the severe problem of the nitride semiconductor cracking.

The inventors have identified that cracks occurring in these nitride semiconductors is caused by warping occurring in two stages during the manufacturing process of the semiconductor devices.

Figure 1:
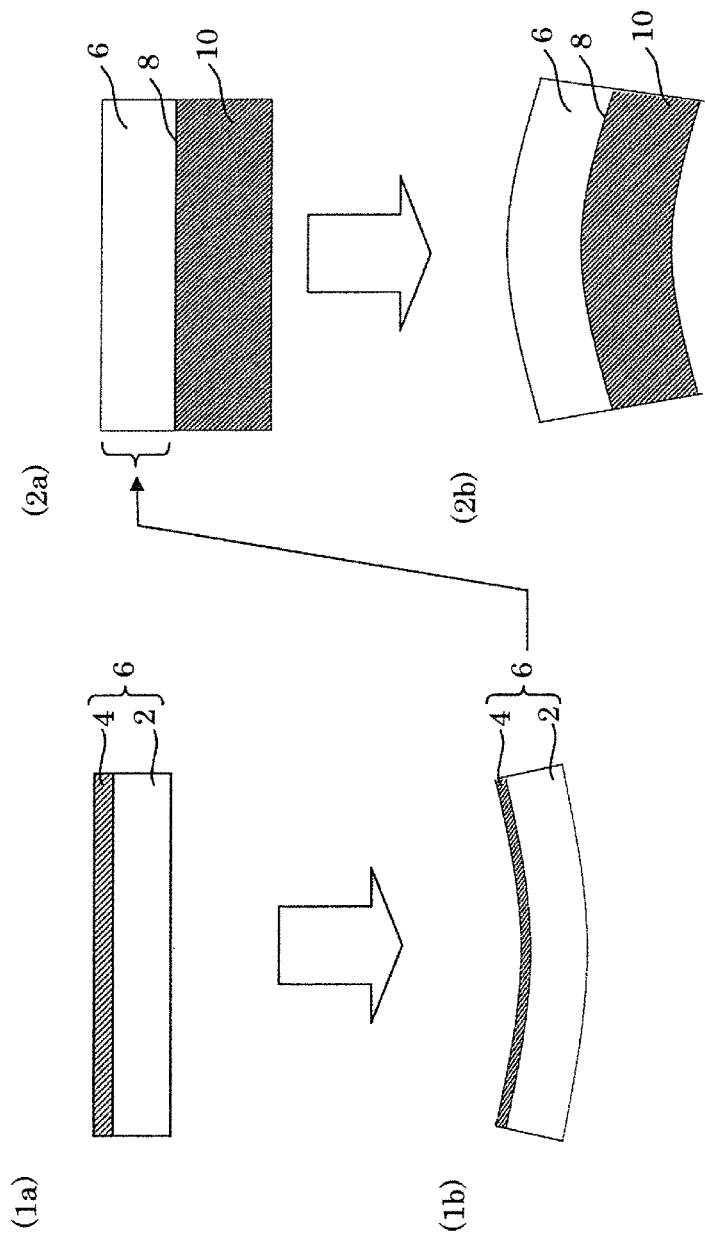
FIG. 1 is an explanatory diagram showing a mechanism of how warping in a nitride semiconductor chip occurs in two stages.

FIG. 1 is an explanatory diagram showing a mechanism of how warping in nitride semiconductor chip 6 occurs in two stages.

A first stage of the warping will be described first.

Images (1a) and (1b) of FIG. 1 show the mechanism of the warping occurring in nitride semiconductor chip 6 during the first stage. As illustrated in images (1a) and (1b) of FIG. 1, nitride semiconductor chip 6 includes silicon substrate 2 and InGaAlN layer 4. Silicon substrate 2 is a base for forming InGaAlN layer 4 on, and is cheaper, is easier to work with, and has lower thermal resistance than sapphire substrates. InGaAlN layer 4 is made of $In_xGa_yAl_{1-x-y}N$ formed on a surface of silicon substrate 2 through epitaxial growth. x and y indicate a compositional ratio as described above. InGaAlN layer 4 is also referred to as epilayer (short for epitaxial layer) or nitride layer.

Image (1a) of FIG. 1 schematically shows nitride semiconductor chip 6 under a high temperature, i.e., during epitaxial growth. When InGaAlN layer 4 is being epitaxially grown on silicon substrate 2, nitride semiconductor chip 6 reaches a temperature of approximately 1000° C.

In contrast, image (1b) of FIG. 1 schematically shows nitride semiconductor chip 6 under room temperature (e.g. approximately 25° C.), i.e., when having been cooled down to room temperature after the epitaxial growth. The temperature difference going from the high temperature to room temperature and a difference in the rate of thermal expansion between silicon substrate 2 and InGaAlN layer 4 cause nitride semiconductor chip 6 to warp protruding downward.

To be more specific, the thermal expansion coefficient of InGaAlN layer 4 is approximately $5.45 \times 10^{-6}/°$ C. and the thermal expansion coefficient of silicon substrate 2 is approximately $2.4 \times 10^{-6}/°$ C. The thermal expansion coefficient of InGaAlN layer 4 is greater than the thermal expansion coefficient of silicon substrate 2. Accordingly, InGaAlN layer 4 contracts more than silicon substrate 2 due to the temperature difference going from the high temperature to room temperature. This causes nitride semiconductor chip 6 to warp protruding downward. Note that the warping in image (1b) of FIG. 1 is exaggerated for the sake of illustration.

Silicon substrate 2 is affected by the stress from InGaAlN layer 4 and warps protruding downward more as silicon substrate 2 is thinner. The tensile stress in silicon substrate 2 becomes larger due to the warping protruding downward. When this tensile stress exceeds the permissible stress, nitride semiconductor chip 6 ruptures.

The second stage of the warping will be described next.

Images (2a) and (2b) of FIG. 1 show the mechanism of the warping occurring in nitride semiconductor chip 6 during the second stage. Images (2a) and (2b) of FIG. 1 show a laminate of nitride semiconductor chip 6 and die pad 10. Die pad 10 is, for example, part of a lead frame, and a Cu-substrate. The laminate includes nitride semiconductor chip 6 and die pad 10 bonded to each other by adhesive 8 during the manufacturing process of the semiconductor device. Adhesive 8 is solder.

Image (2a) of FIG. 1 schematically shows the laminate under a high temperature, i.e., when nitride semiconductor chip 6 is soldered to die pad 10. Under the high temperature during the soldering, nitride semiconductor chip 6 is not fixed to die pad 10 since the solder has been dissolved in a liquid, and the warping of the second stage does not occur yet. The solder as adhesive 8 is, for example, Pb or gold-silicon (AuSi), and the temperature of the laminate during the soldering is approximately 360° C. to 380° C. Nitride semiconductor chip 6 at this time has undergone the warping protruding downward in the first stage shown in image (1b) of FIG. 1. Since the state in image (2a) of FIG. 1, however, is at a lower temperature than in image (1a) and higher than in image (1b), the warping of nitride semiconductor chip 6 in the first stage may be subdued somewhat.

In contrast, image (2b) of FIG. 1 schematically shows the laminate at room temperature, i.e., the temperature after the bonding through soldering. Nitride semiconductor chip 6 is fixed to die pad 10 with adhesive 8. The temperature difference going from the high temperature during the soldering to room temperature and the difference in a rate of thermal expansion between nitride semiconductor chip 6 and die pad 10 cause the laminate to warp protruding upward as the warping in the second stage. The warping in image (2b) of FIG. 1 is, however, exaggerated for the sake of description.

To explain more specifically, the thermal expansion coefficient of silicon substrate 2, which makes up the most part of nitride semiconductor chip 6, is $2.4 \times 10^{-6}/°$ C. The thermal expansion coefficient of die pad 10 (here, the Cu-substrate) is approximately $16.8 \times 10^{-6}/°$ C. The contraction of die pad 10 (Cu-substrate) is greater than the contraction of silicon substrate 2 when going from the high temperature to room temperature since the thermal expansion coefficient of the Cu-substrate is greater than the thermal expansion coefficient of silicon substrate 2. Accordingly, the laminate warps protruding upward in the second stage.

The above two stages are superimposed. In other words, the downward protruding warping of nitride semiconductor chip 6 (image (1b) of FIG. 1) becomes the opposite upward protruding warping in the second stage (image (2b) of FIG. 1) since the thermal expansion coefficient of the Cu-substrate die pad 10 is sufficiently greater than the thermal expansion coefficient of silicon substrate 2. At this time does the tensile stress in nitride semiconductor chip 6 become even greater.

As described above, in the first stage, the relationship between the thickness and warping of silicon substrate 2 of nitride semiconductor chip 6 in image (1b) of FIG. 1 causes silicon substrate 2 to warp protruding upward more as it is thinner. In the second stage, the relationship between nitride semiconductor chip 6 and the warping of the Cu-substrate die pad 10 in image (2b) of FIG. 1 causes silicon substrate 2 to warp protruding upward more as it grows thicker.

The warping in these two stages is the cause of cracks occurring in nitride semiconductor chip 6.

In the related art disclosed in PTL 1, the nitride semiconductor chip on the sapphire substrate is limited. Nitride semiconductor chip 6 disposed on silicon substrate 2, which has higher thermal conductivity than sapphire and costs less, is suitable as a power device.

The thermal expansion coefficient of sapphire is 8.5 ppm/° C. whereas the thermal expansion coefficient of silicon is 3.4 ppm/° C. Since the difference with the 7.8 ppm/° C. thermal expansion coefficient of GaN is greater when using silicon rather than sapphire, the silicon-based nitride semiconductor chip 6 is more prone to cracks occurring than a sapphire-based nitride semiconductor chip.

In PTL 1, an AlN-substrate heat sink is used between the chip and the package, but the die pad, which includes Cu, being more thermally conductive and cheaper than AlN, may be mounted directly as a power device.

The nitride semiconductor chip is joined with Pb-free solder, but may also be joined with Pb-solder that is more reliable for power devices.

Accordingly, the inventors have experimented with the influence of the length of nitride semiconductor chip 6 on the semiconductor device, which includes the silicon-based nitride semiconductor chip 6 and die pad 10, which includes Cu, with regard to the occurrence of cracks.

The criteria of the experiments are as follows. Thickness tm of die pad 10 was set at 0.2 mm and thickness tc of nitride semiconductor chip 6 was set at 0.25 mm. Multiple experiments were carried out with the length of nitride semiconductor chip 6 being variables of 2.22 mm, 3.12 mm, 3.97 mm, and 4.69 mm.

The inventors have identified from the experiment results under these criteria that cracks occur in the nitride semiconductor chip when length L of nitride semiconductor chip is at least 3.12 mm.

The cause is considered to be the warping in the two stages during the manufacturing process as described previously. In other words, during the first stage, the nitride semiconductor chip warps protruding downward when returning from the high temperature growing state of the MOCVD to room temperature since the thermal expansion coefficient of GaN is greater than the thermal expansion coefficient of silicon. In the second stage, nitride semiconductor chip 6 warps protruding upward when returning from at least the temperature of the melting point of the adhesive to room temperature in the case when die pad 10, which includes Cu, and has a greater thermal expansion coefficient than the thermal expansion coefficient of a silicon substrate, has been mounted. In other words, when a downward protruding and upward protruding stress is applied to nitride semiconductor chip 6, cracks are considered to occur when the tension inside of nitride semiconductor chip 6 exceeds a certain threshold value.

One objective of the present disclosure is to provide a semiconductor device having a structure that limits the occurrence of cracks in nitride semiconductor chip 6, which is bonded to the Cu-substrate die pad with the Pb-solder and has a length of at least 3.12 mm.

EMBODIMENTS

Hereinafter, the semiconductor device according to the embodiments in the present disclosure will be described with reference to the drawings. Note that each of the embodiments described below shows a specific example in the present disclose, and numerical values, shapes, components and the placement of components, connections, and the like are mere examples and are not intended to limit the present disclosure.

Embodiment 1

A configurational example of nitride semiconductor chip 6 will be described first.

Figure 2:
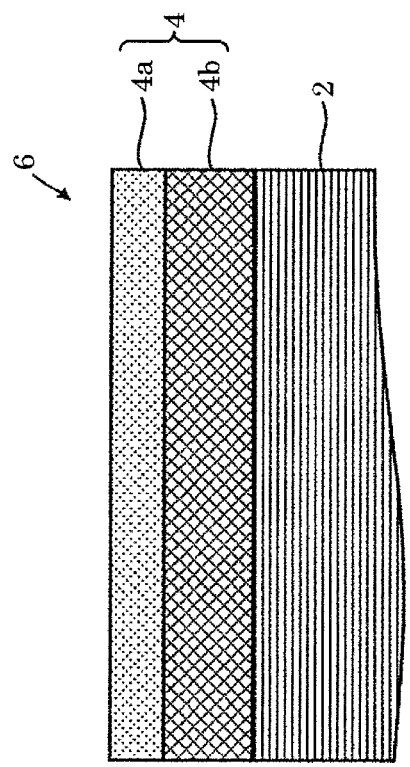
FIG. 2 is a cross-sectional view of a configurational example of the nitride semiconductor chip according to Embodiment 1.

FIG. 2 is a cross-sectional view of the configurational example of nitride semiconductor chip 6 installed in the nitride semiconductor device according to Embodiment 1. Nitride semiconductor chip 6 shown in FIG. 2 includes silicon substrate 2 and InGaAlN layer 4. InGaAlN layer 4 includes active layer 4a and buffer layer 4b.

This nitride semiconductor chip 6 is at least 0.250 mm thick, and includes InGaAlN layer 4 disposed on silicon substrate 2 with a first thermal expansion coefficient, InGaAlN layer 4 being in contact with the surface of silicon substrate 2, several μm thick, and having a third thermal expansion coefficient. InGaAlN layer 4 is, for example, an $In_xGa_yAl_{1-x-y}N$ layer ($0 \le x \le 1$, $0 \le y \le 1$, $0 \le x+y \le 1$) layer epitaxially grown though MOCVD. Note that the compositional ratio of x and y may also be 0≤x≤1, 0≤y≤1, x+y<1. The third thermal expansion coefficient of InGaAlN layer 4 is greater than a first thermal expansion coefficient of silicon substrate 2. Active layer 4a includes a source region, drain region, channel, and the like for forming a power transistor. Buffer layer 4b is for reducing crystal defects in active layer 4a.

This nitride semiconductor chip 6 is fixed to the die pad and sealed into the semiconductor device with resin together with a plurality of terminals. Since this nitride semiconductor chip 6 is a wide-bandgap semiconductor with a large bandgap, nitride semiconductor chip 6 has a high breakdown voltage and is suitable for power devices that require low resistance and high voltages. The nitride semiconductor can be made of various mixed crystals and can readily be made with a heterojunction interface.

The heterojunction of the nitride semiconductor is characterized by a high-density two-dimensional electron gas layer (2DEG layer) occurring in the heterojunction interface of the nitride semiconductor through intrinsic polarization or piezoelectric polarization even in an undoped state.

A field-effect transistor (FET), which uses this high-density 2DEG layer as a carrier, is used as a power device for carrying a large amount of power and high frequencies.

A configurational example of semiconductor device 1 will be described next.

Figure 3:
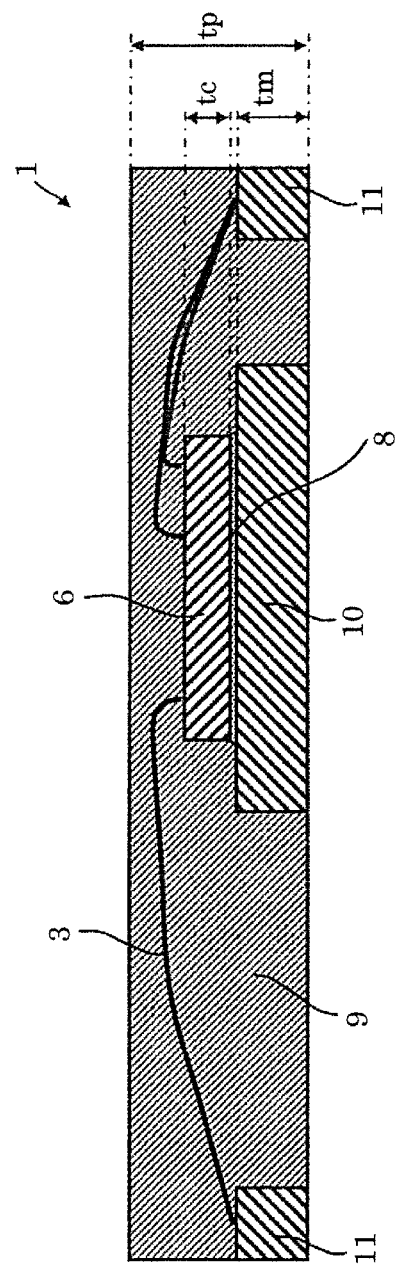
FIG. 3 is a cross-sectional view of a configurational example of a semiconductor device according to Embodiment 1.
Figure 4:
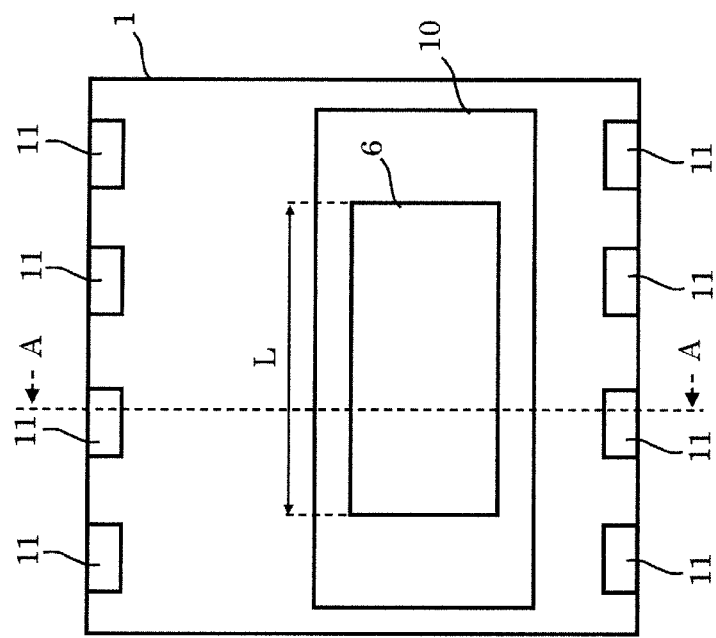
FIG. 4 is a top perspective view of the configurational example of the semiconductor device according to Embodiment 1.

FIG. 3 is a cross-sectional view of the configurational example of semiconductor device 1 according to Embodiment 1. FIG. 4 is a top perspective view of the configurational example of semiconductor device 1 according to Embodiment 1. FIG. 3 corresponds to the cross section along line AA in FIG. 4. tm in the drawing is the thickness of die pad 10, tc is the thickness of nitride semiconductor chip 6, tp is the thickness of semiconductor device 1, and L is the length of nitride semiconductor chip 6.

Semiconductor device 1 in FIGS. 3 and 4 includes bonding wire 3, nitride semiconductor chip 6, adhesive 8, resin 9, die pad 10, and terminals 11.

Bonding wire 3 is metal wiring, e.g. gold, copper, aluminum, and connects the pad of nitride semiconductor chip 6 and terminals 11.

Nitride semiconductor chip 6 has, for example, the configuration in FIG. 2, and is bonded on an upper surface of the Cu-substrate die pad 10 with adhesive 8. Length L of nitride semiconductor chip 6 is at least 3.00 mm.

Adhesive 8 is, for example, Pb-solder, and joins nitride semiconductor chip 6 to the Cu-substrate die pad 10.

Resin 9 seals off nitride semiconductor chip 6, the Cu-substrate die pad 10, and the like. Semiconductor device 1 forms a surface mount rectangular package with resin 9.

Die pad 10 is at least 0.200 mm thick and includes the Cu-substrate with the second thermal expansion coefficient. The second thermal expansion coefficient is approximately $16.8 \times 10^{-6}/°$ C., and is greater than the thermal expansion coefficient of silicon substrate 2 (the first thermal expansion coefficient, approximately $2.4 \times 10^{-6}/°$ C.). Thickness tm of the Cu-substrate die pad 10 is greater than thickness tc of nitride semiconductor chip 6. Die pad 10 is larger than nitride semiconductor chip 6. The outline of nitride semiconductor chip 6 is contained inside the outline of die pad 10 in a plan view.

Each one of terminals 11 is connected to the pad of nitride semiconductor chip 6 with bonding wire 3, and is soldered when semiconductor device 1 is mounted on another printed board. The mounting on the printed board of semiconductor device 1 is referred to as secondary mounting with respect to nitride semiconductor chip 6. Terminals 11 include, for example, a gate terminal, source terminal, and drain terminal.

A more concrete configurational example and exterior of semiconductor device 1 will be described next.

Figure 5A:
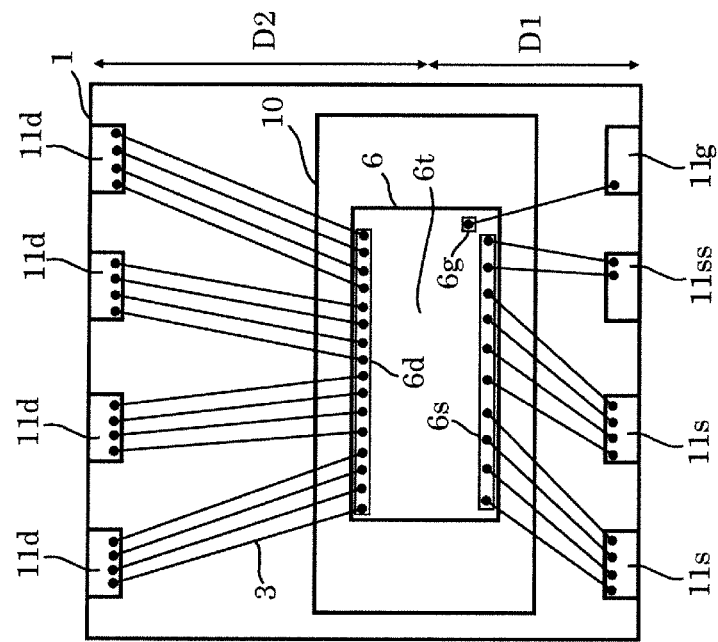
FIG. 5A is a top perspective view of a more concrete configurational example of the semiconductor device according to Embodiment 1.
Figure 6:
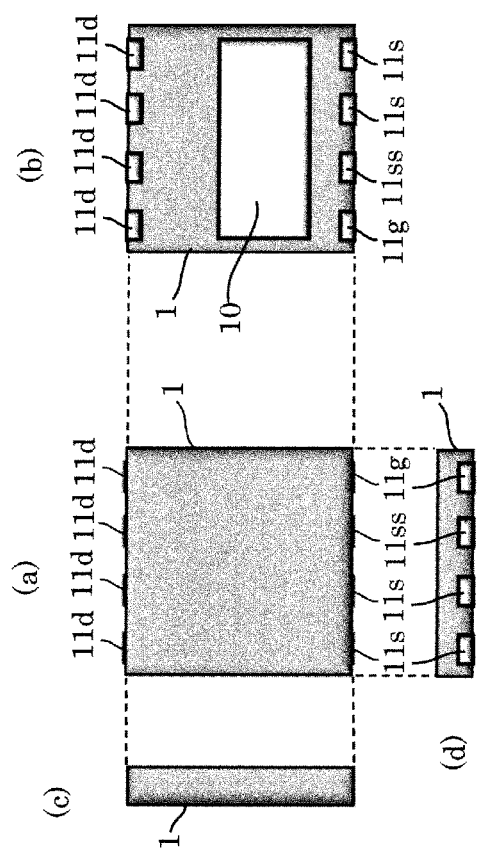
FIG. 6 is an orthographic view of an exterior of the semiconductor device according to Embodiment 1.

FIG. 5A is a top perspective view of a more concrete configurational example of semiconductor device 1 according to Embodiment 1. FIG. 6 is an orthographic view of the exterior of semiconductor device 1. (a) of FIG. 6 shows a top surface, (b) shows a bottom surface, (c) shows a left side surface, and (d) shows a bottom side surface.

Nitride semiconductor chip 6 includes transistor 6t, gate pad 6g, source pad 6s, and drain pad 6d.

Transistor 6t is a power transistor including InGaAlN layer 4.

Gate pad 6g is connected to a gate of transistor 6t and is used for the wire bonding.

Source pad 6s is connected to a source of transistor 6t, and is used for the wire bonding. In the drawing, the elongated source pad 6s is joined to a plurality of bonding wires 3. Source pad 6s is disposed at a first length out of two opposed lengths of nitride semiconductor chip 6. In FIG. 5A and (a) and (b) of FIG. 6, the first length is the bottom-end length.

Drain pad 6d is connected to a drain of transistor 6t and is used for the wire bonding. In the drawing, the elongated drain pad 6d is joined to a plurality of bonding wires 3. Drain pad 6d is disposed at a second length opposing the first length. In FIG. 5A and (a) and (b) of FIG. 6, the second length is the top-end length.

Drain pad 6d and source pad 6s are not disposed at the same side of nitride semiconductor chip 6, but are disposed at opposed sides of nitride semiconductor chip 6. This facilitates maintaining the pressure resistance between the drain and the source.

In the configurational example shown in FIGS. 5A and 6, semiconductor device 1 is a rectangular package.

Terminals 11 shown in FIG. 4 are, for example, disposed as gate terminal 11g, source sensor terminal 11ss, source terminals 11s, and drain terminals 11d in FIG. 5A. In the drawing, terminals 11 include one gate terminal 11g, one source sensor terminal 11ss, two source terminals 11s, and four drain terminals 11d.

Gate terminal 11g is connected to gate pad 6g with bonding wire 3.

Source terminals 11s and source sensor terminal 11ss are each connected to source pad 6s with bonding wire 3. Source sensor terminal 11ss can be used for detecting voltage levels and the like.

Drain terminals 11d are each connected to drain pad 6d with bonding wire 3.

Terminals 11 are dispersed at a first side and a second side that are two opposed sides in a plan view of semiconductor device 1, and not at the other two sides. The two sides at which terminals 11 are disposed are parallel with the two lengths, the first side and the second side, of nitride semiconductor chip 6.

Gate terminal 11g, source terminals 11s, and source sensor terminal 11ss are disposed at the first side. In FIG. 5A and (a) and (b) of FIG. 6, the first side is the bottom side. Drain terminals 11d are disposed at the second side. In FIG. 5A and (a) and (b) of FIG. 6, the second side is the top side. The first side and the second side have the same number of terminals 11. Terminals 11 are all equal in size, base area and side area. The first side terminals 11 and the second side terminals 11 are symmetrical (horizontally symmetrical in FIGS. 5A and 6). The distance between adjacent terminals 11 is equal on the first side and the second side. This allows the soldering conditions during the secondary mounting, i.e., the solder wetting area, placement, and the like, to be uniform at the first side and the second side, preventing any imbalances. This limits bias during the secondary mounting.

As illustrated in (a), (b), and (d) of FIG. 6, each of terminals 11 is substantially flush with the side surfaces of semiconductor device 1. This makes it possible to keep the mounting surface during the secondary mounting at an absolute minimum. Each of terminals 11 may also be substantially flush with the underside of semiconductor device 1.

As illustrated in (b) of FIG. 6, out of two opposed main surfaces of die pad 10, the main surface not joined to nitride semiconductor chip 6 is exposed from semiconductor device 1. In other words, the underside of semiconductor device 1 is exposed to the backside of die pad 10. This increases the heat dissipation of die pad 10.

Figure 5B:
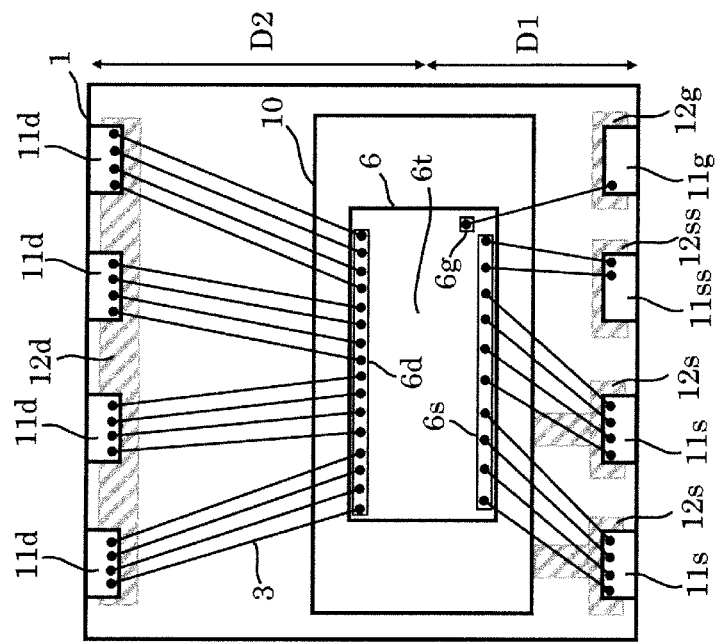
FIG. 5B is a top perspective view of another more concrete configurational example of the semiconductor device according to Embodiment 1.

Note that semiconductor device 1 as illustrated in FIG. 5B may further include electrodes 12d, 12s, and 12g. These electrodes 12d, 12s, and 12g may also be disposed as a portion of the lead frame along with die pad 10 and terminals 11.

Electrode 12d mutually and electrically connects the four terminals 11d Electrodes 12s are each electrically connected to a corresponding one of source terminals 11s and die pad 10. This makes it possible to use semiconductor device 1 as a source grounding circuit. Electrode 12g is electrically connected to terminal 11g. Electrodes 12d and 12s facilitate maintaining the ampacity. The contact area of the resin and the terminals is bigger, and resin peeling is limited due to increased adhesiveness.

Out of terminals 11, all terminals disposed at the second side are separated from die pad 10. In FIGS. 5A and 5B, the terminals disposed at the second side are the four drain terminals 11d and are separated from die pad 10. Separated here means distance-wise, physically, and electrically. In FIG. 5A, source terminals 11s and source sensor terminal 11ss are separated from die pad 10, but in FIG. 5B, source terminals 11s and source sensor terminal 11ss are separated distance-wise and physically, but not electrically.

Source terminals 11s and source sensor terminal 11ss, and drain terminals 11d are disposed respectively at two opposed sides of the rectangular package. Distance D2, which extends from the second side to the center of die pad 10 in the plan view of semiconductor device 1, is longer than distance D1, which extends from the first side to the center of die pad 10. In other words, the distance between the second side of semiconductor device 1 and the second length of nitride semiconductor chip 6 is longer than the distance between the first side of semiconductor device 1 and the first length of nitride semiconductor chip 6. This facilitates maintaining the pressure resistance between the drain and the source.

The experiment results relating to a crack occurrence rate of nitride semiconductor chip 6 and thickness tc of nitride semiconductor chip 6 will described next.

Figure 7:
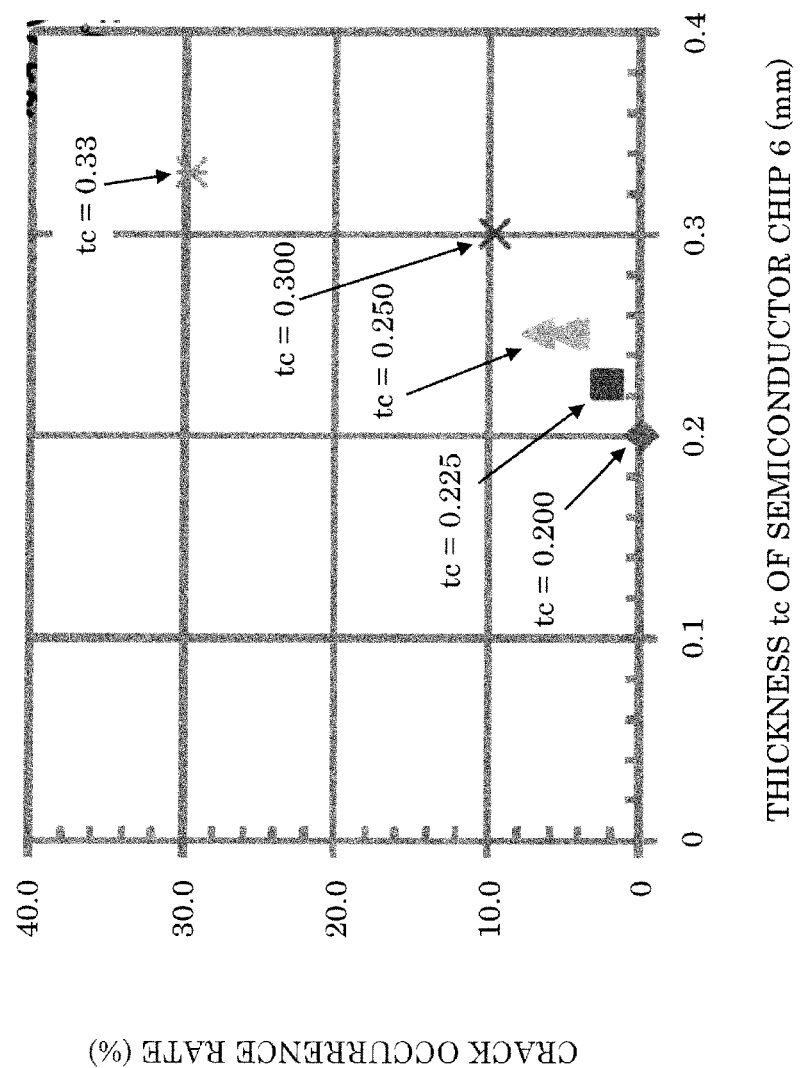
FIG. 7 is a graph showing a correlation between a crack occurrence rate of the nitride semiconductor chip and a thickness of the nitride semiconductor chip.

FIG. 7 is a graph showing a correlation between thickness tc of nitride semiconductor chip 6 and a crack occurrence rate of nitride semiconductor chip 6. After experimenting with the crack occurrence rate of nitride semiconductor chip 6, results of the following plurality of thicknesses tc of nitride semiconductor chip 6 have been obtained as shown in FIG. 7. The criteria of the experiments are as follows. Thickness tm of die pad 10 has a fixed value of 0.200 mm and length L of nitride semiconductor chip 6 has a fixed value of 4.79 mm. Thickness tc of nitride semiconductor chip 6 includes 0.200 mm, 0.225 mm, 0.250 mm, 0.300 mm, and 0.330 mm.

The horizontal axis in the drawing indicates thickness tc of nitride semiconductor chip 6 and the vertical axis indicates the crack occurrence rate. The following can be understood from the drawing. When thickness tc of nitride semiconductor chip 6 is at least 0.225 mm, cracks occur in nitride semiconductor chip 6. When thickness tc of nitride semiconductor chip 6 becomes thinner (from 0.330 mm to 0.200 mm), the crack occurrence rate of the nitride semiconductor chip tends to decrease. When thickness tc of nitride semiconductor chip 6 is 0.200 mm, the crack occurrence rate is 0%. There is a standard value for which cracks do not occur in the range of thickness tc of nitride semiconductor chip 6 being at least 0.200 mm and less than 0.225 mm. Thickness tc of nitride semiconductor chip 6 at 0.200 mm can be considered to have a crack occurrence rate of 0%.

Simulation results for examining a von Mises stress in nitride semiconductor chip 6 will be described next with reference to FIGS. 8A to 10. The von Mises stress occurring in nitride semiconductor chip 6 is calculated by simulating the mechanism in which warping occurs in two stages as shown in FIG. 1. Von Mises stress here indicates a stress state occurring inside an object with a single value and is scalar without any direction.

Figure 8A:
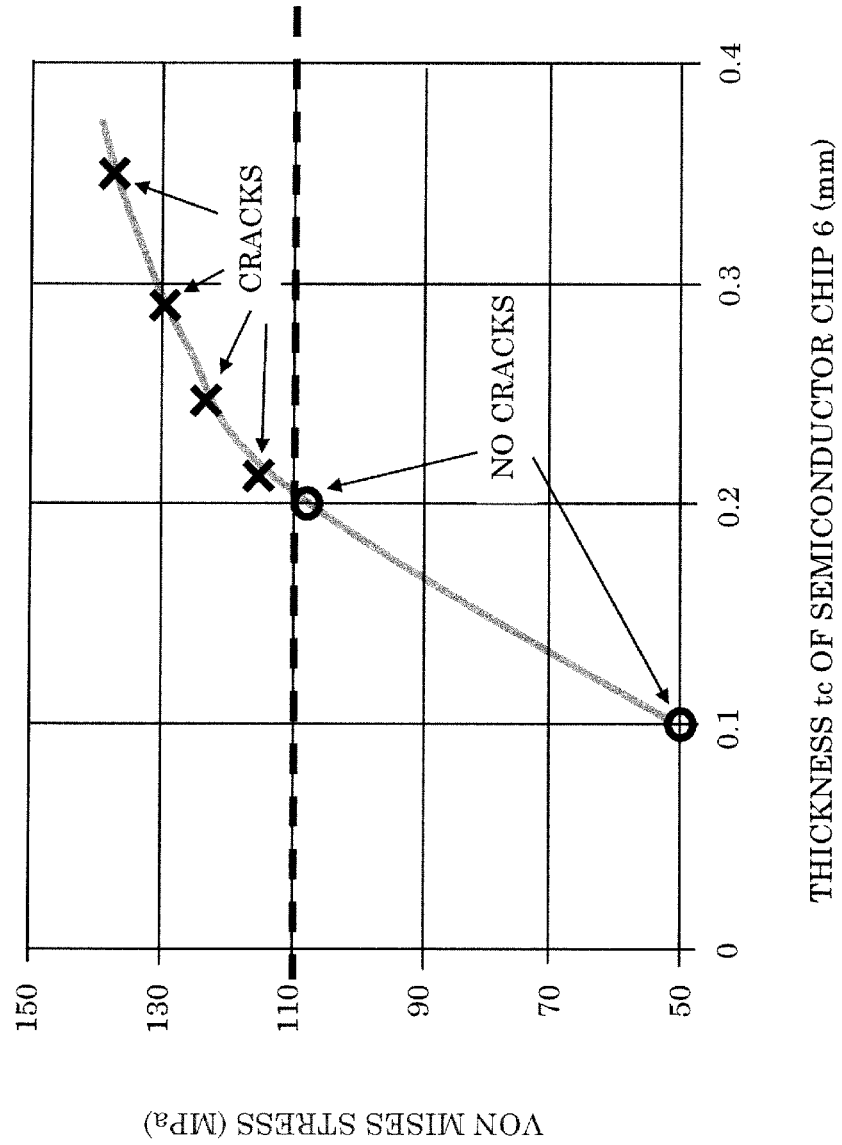
FIG. 8A is a graph showing a correlation between the thickness of the nitride semiconductor chip and a von Mises stress therein.

FIG. 8A is a graph showing a correlation between thickness tc of nitride semiconductor chip 6 and the von Mises stress. In the drawing, the horizontal axis indicates thickness tc of nitride semiconductor chip 6 and the vertical axis indicates the von Mises stress (MPa). The execution conditions of the simulation for calculating this von Mises stress are as follows. Thickness tm of die pad 10 has a fixed value of 0.200 mm and length L of nitride semiconductor chip 6 has a fixed value of 4.79 mm. A thickness of the epilayer has a value of 4 μm. Thickness tc of nitride semiconductor chip 6 has been simulated in the range of 0.100 mm to 0.350 mm.

FIG. 8A shows that the von Mises stress monotonically increases with a thickness of nitride semiconductor chip 6 from 0.100 mm to 0.35 mm. There is an inflection point around 0.200 mm which is approximately thickness tc of nitride semiconductor chip 6 and also thickness tm of the Cu-substrate die pad 10, and the von Mises stress is reduced more around the boundary of the inflection point by setting thickness tc of nitride semiconductor chip 6 to 0.200 mm or less, and it can be understood that it is possible to limit cracks in the nitride semiconductor.

The circles and crosses on the curve in FIG. 8A indicate whether cracks occur or not in accordance with FIG. 7. In other words, a circle indicates that cracks do not occur and a cross indicates that cracks do occur. In FIGS. 7 and 8A, the crack occurrence rate is substantially 0% for the relationship between the von Mises stress and thickness tc of nitride semiconductor chip 6 when thickness tc of nitride semiconductor chip 6 is 0.200 mm or less. This makes it possible to understand that cracks do not occur when the von Mises stress corresponding to a thickness tc of nitride semiconductor chip 6 of 0.200 mm is 110 MPa or less.

Figure 8B:
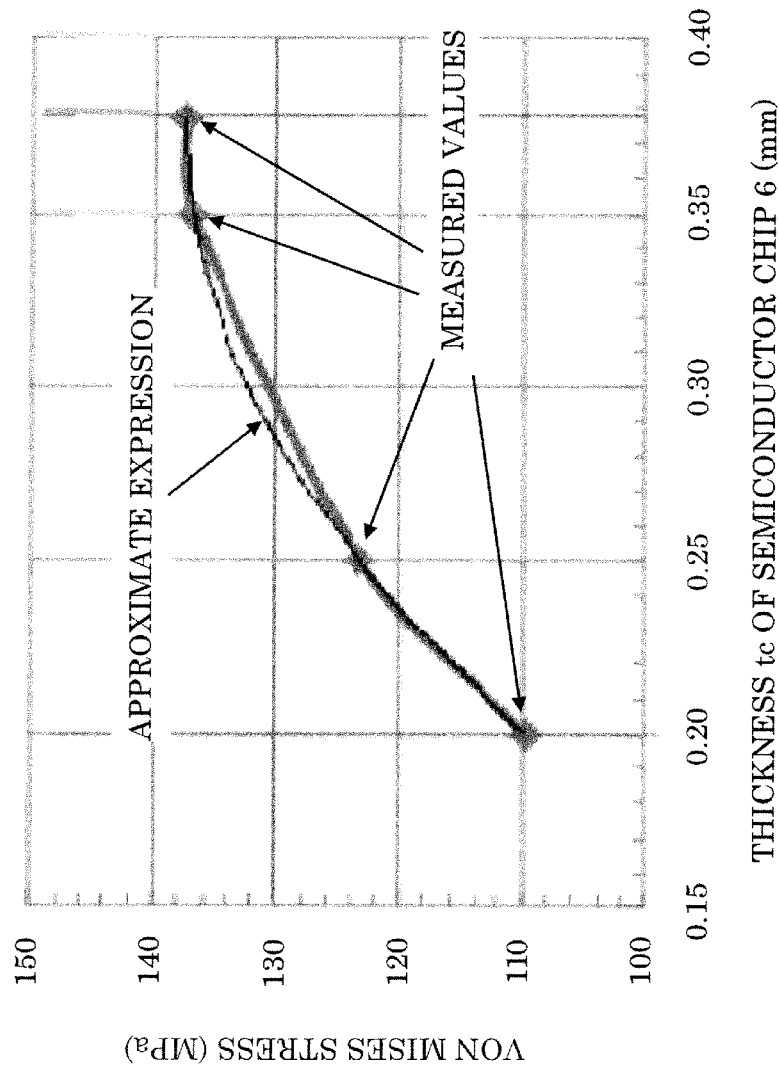
FIG. 8B is a graph showing the correlation between the thickness of the nitride semiconductor chip and the von Mises stress therein, and a curve determined by an approximate expression.

FIG. 8B is a graph showing the correlation between thickness tc of nitride semiconductor chip 6 and the von Mises stress, and a curve determined by an approximate expression with the portion of the horizontal axis in FIG. 8A enlarged from 0.200 mm. The thick solid line in the drawing connects adjacent simulation values and is made of three line segments. The thin solid line in the drawing is a curve that passes through the simulation values and is approximated using a polynomial expression. This polynomial expression is a secondary approximate expression, and is expressed in the drawing with $y=-890 \times tc^2+670 \times tc+11.3$, with y being the von Mises stress.

In FIG. 8B, the approximate expression of the von Mises stress after nitride semiconductor chip 6 has been mounted on die pad 10 and thickness tc of nitride semiconductor chip 6 shows that the von Mises stress increases when thickness tc of nitride semiconductor chip 6 is at least 0.200 mm, and that the von Mises stress reaches a maximum value when thickness tc of nitride semiconductor chip 6 is 0.377 mm. In other words, the von Mises stress increases when thickness tc is between 0.200 mm and 0.377 mm. When thickness tc is greater than 0.377 mm, the von Mises stress is considered to stay roughly the same.

Figure 9:
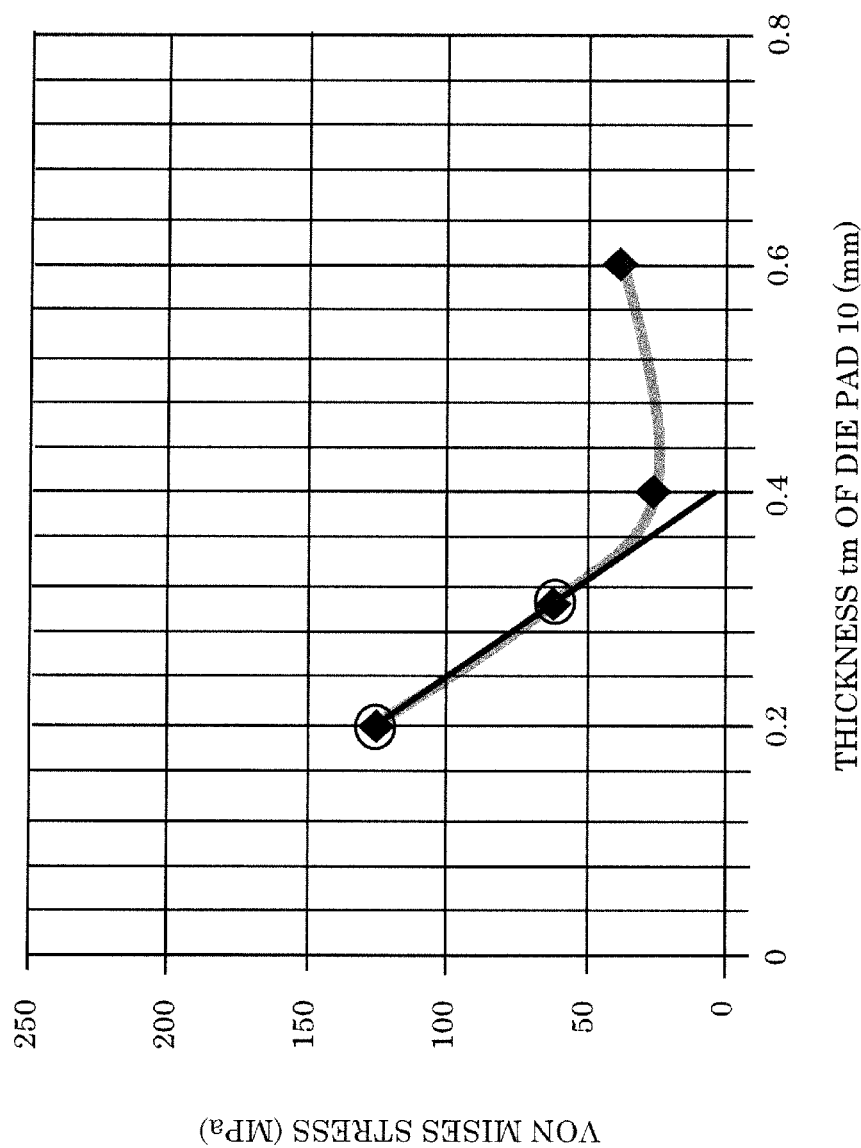
FIG. 9 is a graph showing a correlation between a thickness of a die pad including a copper (Cu) substrate and a von Mises stress therein.

FIG. 9 is a graph showing a correlation between thickness tm of the Cu-substrate die pad 10 and the von Mises stress. In the drawing, the horizontal axis is thickness tm of die pad 10 and the vertical axis is the von Mises stress (MPa). The execution conditions of the simulation for calculating this von Mises stress are as follows. Thickness tc of nitride semiconductor chip 6 has a fixed value of 0.25 mm and length L of nitride semiconductor chip 6 has a fixed value of 4.79 mm. Thickness tm of die pad 10 has been simulated in the range of 0.2 mm to 0.6 mm.

The von Mises stress monotonically decreases with a thickness tm of die pad 10 from 0.2 mm to 0.4 mm.

In FIG. 9, the thick solid line connects the von Mises stress values achieved through the simulation. The von Mises stress monotonically decreases with a thickness of the Cu-substrate die pad 10 from 0.200 mm to 0.400 mm. In other words, it is possible for the von Mises stress to become smaller as thickness tm of the Cu-substrate die pad 10 increases, and it can be understood that cracks can be limited.

The thin solid line consists of line segments that are linearly approximated as a straight line that passes through circled measuring points between a thickness tm of die pad 10 of 0.2 mm and 0.4 mm. As a result of the linear approximation, the relationship between von Mises stress F and thickness tm of the Cu-substrate die pad 10 can be expressed with $F=-593 \times tm+242$. In further deliberation, the conversion coefficient from the tm value to the F value is $-593$.

Figure 10:
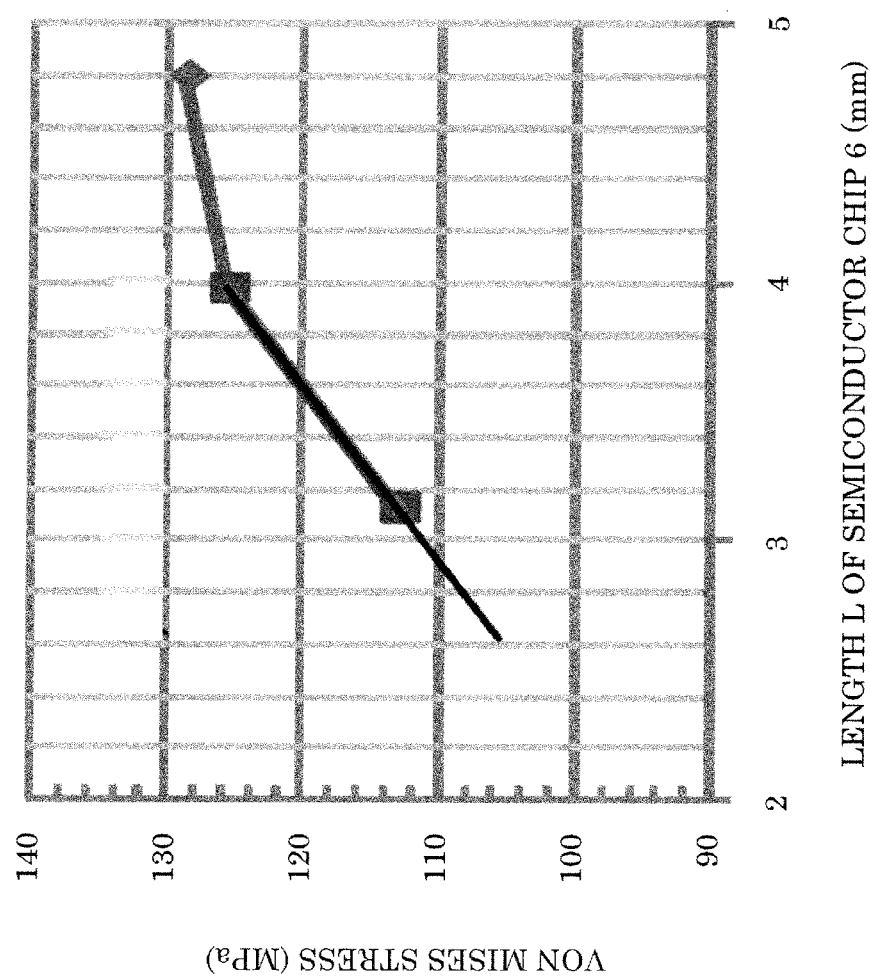
FIG. 10 is a graph showing a correlation between a length of the nitride semiconductor chip and a von Mises stress therein.

FIG. 10 is a graph showing a correlation between length L of nitride semiconductor chip 6 and the von Mises stress. The execution conditions of the simulation for calculating this von Mises stress are as follows. Thickness tm of die pad 10 has a fixed value of 0.2 mm and thickness tc of nitride semiconductor chip 6 has a fixed value of 0.25 mm. Length L of nitride semiconductor chip 6 has been simulated in the range of 3.12 mm to 4.79 mm.

FIG. 10 shows that the von Mises stress monotonically increases with a length L of nitride semiconductor chip 6 being at least 3.12 mm and at most 4.79 mm. In other words, it can be understood that the von Mises stress increases as length L of nitride semiconductor chip 6 becomes longer.

As illustrated in FIGS. 8A to 10, the von Mises stress in nitride semiconductor chip 6 obtain through the simulation, thickness tc of nitride semiconductor chip 6, thickness tm of die pad 10, and length L of nitride semiconductor chip 6 have all been calculated as variables.

Hereinafter, the conditions in which cracks do not occur in nitride semiconductor chip 6 and the von Mises stress does not exceed 110 MPa will be described based on these simulation results.

Figure 11:
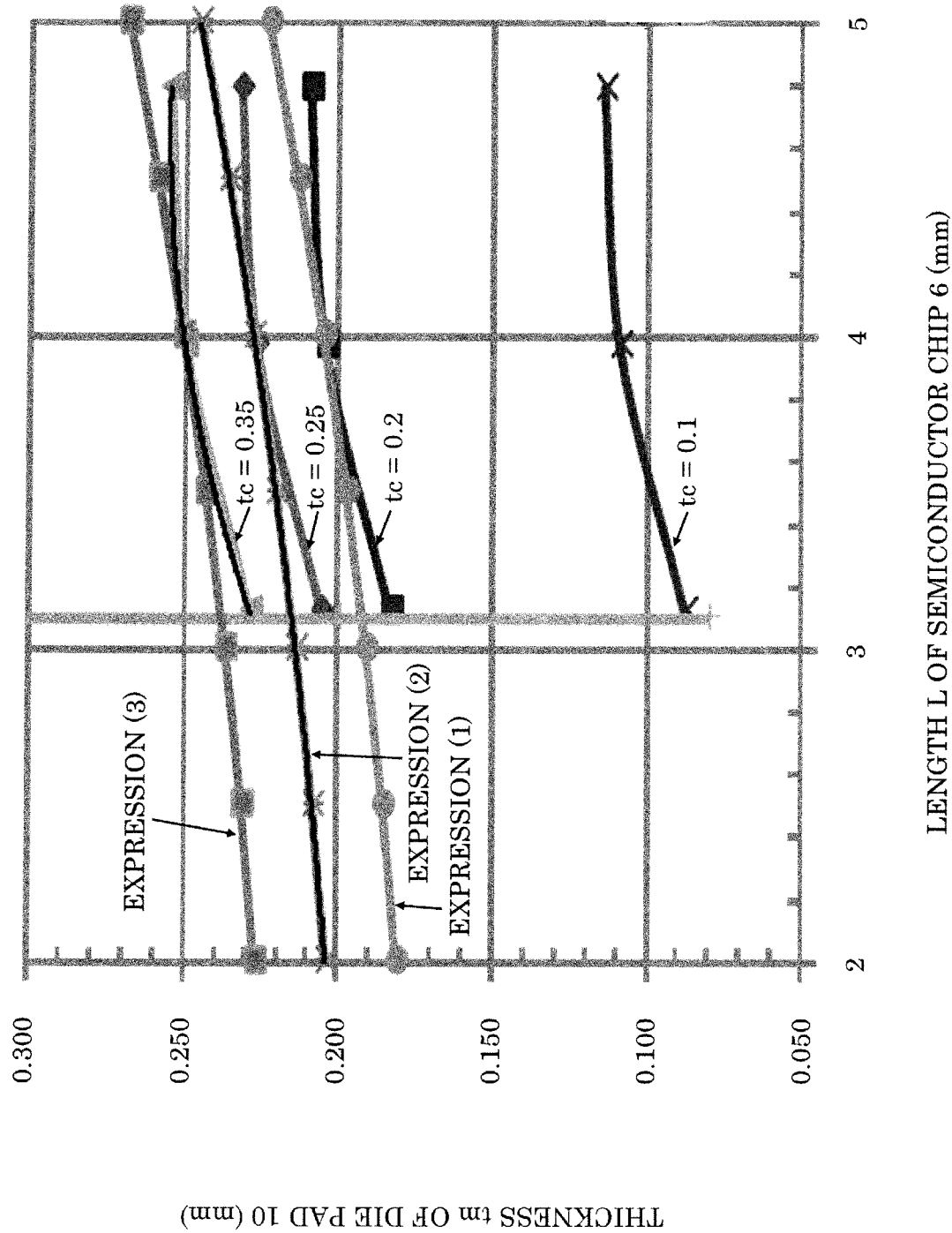
FIG. 11 is a graph showing (i) a result of conditions necessary so the nitride semiconductor chip does not crack and (ii) a correlation between the thickness of the die pad including a Cu-substrate and the length of the nitride semiconductor chip.

FIG. 11 is a graph showing (i) a result of boundary conditions necessary so cracks do not occur in the nitride semiconductor chip and (ii) a correlation between thickness tm of the Cu-substrate die pad 10 and length L of nitride semiconductor chip 6.

In the drawing, four lines corresponding to thickness tc of nitride semiconductor chip 6 being 0.1 mm, 0.2 mm, 0.3 mm, and 0.35 mm (lines with L between 3.12 mm and 4.79 mm) are obtained from the simulation results shown in FIGS. 8A to 10. In other words, when the relationship between length L of nitride semiconductor chip 6 and thickness tm of the Cu-substrate die pad 10 is determined in the case of the von Mises stress being 110 MPa, which is the boundary condition so cracks do not occur, the four lines shown in FIG. 11 are obtained.

The three lines besides the four above lines (approximate expressions (1), (2), and (3)) are curves approximated using a quadratic function that curves protruding downward and will be described later. It can be said that cracks do not occur when thickness tm of die pad 10 is in the region above these curves (i.e., toward the positive end of the vertical axis).

A mathematical model and approximate expressions for representing the relationship between thickness tm of die pad 10 and length L of nitride semiconductor chip 6 will be described next in more detail.

Figure 12:
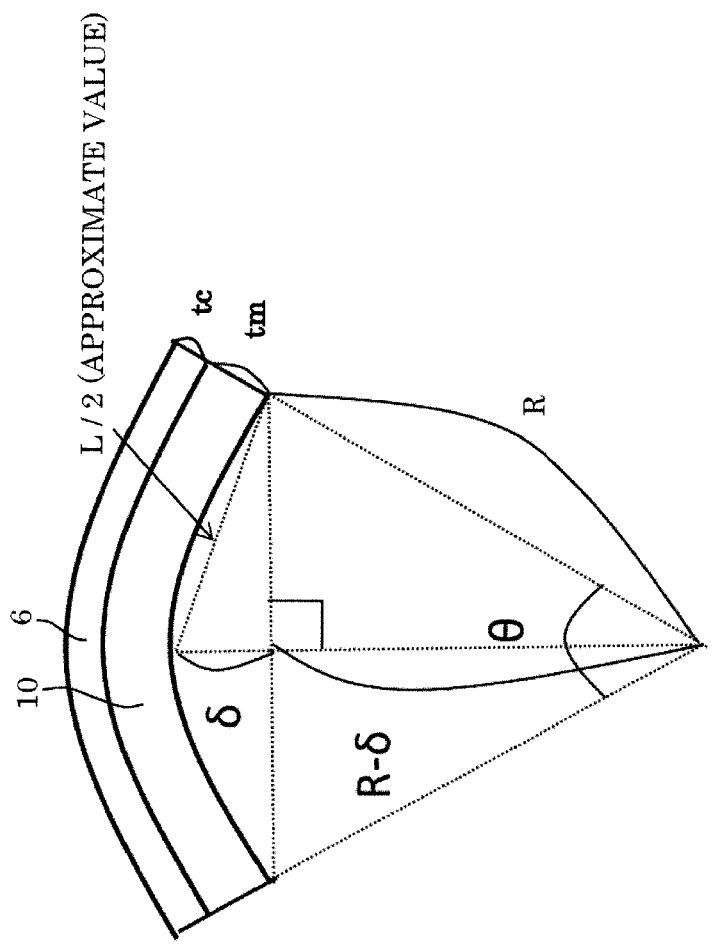
FIG. 12 is a schematic view of a laminated model for quantifying warping occurring therein.

FIG. 12 is a schematic view of a laminated model for quantifying warping 6 occurring therein at room temperature. Note that in this model, any discussion pertaining to the adhesive disposed between nitride semiconductor chip 6 and die pad 10 is omitted. In FIG. 12, the length of nitride semiconductor chip 6 is L, the thickness of the Cu-substrate die pad 10 is tm, the warping degree of die pad 10 is δ, and the curvature radius is R. Using the Pythagorean theorem, the following approximate expressions are obtained.

$$R^2=(R-\delta)^2+\{(L/2)^2-\delta^2\}$$

Consequently, curvature radius R is expression (1).

$$R=L^2/8\delta \qquad \text{expression (1)}$$

This warping δ occurs due to the difference in thermal contraction between nitride semiconductor chip 6 and the Cu-substrate die pad 10 caused by the temperature difference between when the solder is applied and afterwards when the solder cools down. The thermal contraction of the top surface of the Cu-substrate die pad 10 can be considered to be equal to thermal contraction $\Delta L_c$ of nitride semiconductor chip 6. The contraction of the bottom surface of the Cu-substrate die pad 10 can be considered to be equal to thermal contraction $\Delta L_d$ of the material of the die pad.

In this case, if one assumes there is no warping at the high temperature, the following expression is obtained.

$$(R+tm)\,\theta+\Delta L_c=R\theta+\Delta L_d$$

Here, $\Delta L_c=\alpha_c \times L \times \Delta T$, $\Delta L_d=\alpha_d \times L \times \Delta T$. $\alpha_c$ is the coefficient of linear expansion of nitride semiconductor chip 6, $\alpha_d$ is the linear thermal expansion coefficient of die pad 10, $\Delta T$ is the temperature difference between the high temperature during the soldering and room temperature.

Consequently, expression (2) is obtained.

$$tm \times \theta=(L\times\alpha_d-L\times\alpha_c)\Delta T \qquad \text{expression (2)}$$

$L=(R+tm)\theta$ is obtained from FIG. 12. Since R»tm, the following approximate expression is obtained.

$$L=R\theta \qquad \text{expression (3)}$$

A relational expression in which R and θ are eliminated from expression (1), expression (2), and expression (3) is as follows.

$$8\delta \times tm=(\alpha_d-\alpha_c)L^2\times\Delta T$$

Consequently, expression (4) is obtained.

$$tm = (\alpha_d - \alpha_c)L^2 \times \Delta T / 8\delta \quad \text{expression (4)}$$

According to the experiments performed by the inventors thus far, it is necessary to maintain warping 6 of nitride semiconductor chip 6 below or equal to a certain value (e.g. 4 μm) without having to depend on the size of nitride semiconductor chip 6 so that cracks do not occur in nitride semiconductor chip 6. The reason for this is that the stress inside nitride semiconductor chip 6 increases proportionally from the edges of the chip toward the center thereof and that the stress is the largest in the center of the chip.

The cause of this phenomenon is presumed to be because the stress inside nitride semiconductor chip 6 increases proportionally from the edges of the chip toward the center thereof since adhesive 8 (solder) hardens from the edges of nitride semiconductor chip 6 toward the center of nitride semiconductor chip 6.

As a result, cracks occur easily since the warping becomes greater as nitride semiconductor chip 6 is longer, even when nitride semiconductor chip 6 has warped with the same curvature radius R.

Therefore, when ΔT is a certain fixed value, the following expression (5) with ß as proportionality coefficient is necessary to set δ in expression (4) at a certain value so that cracks do not occur in nitride semiconductor chip 6.

$$tm > \beta L^2 \quad \text{expression (5)}$$

In other words, it is necessary to proportionally increase thickness tm of die pad 10 to length L squared of nitride semiconductor chip 6 as length L of nitride semiconductor chip 6 becomes longer.

When calculating a general expression, a following expression (6) is obtained. However, a and b are both constant numbers besides zero.

$$tm = aL^2 + b \quad \text{expression (6)}$$

As stated above, as a boundary condition for cracks not occurring, the relationship between thickness tm of die pad 10 and length L of nitride semiconductor chip 6 is expressed with expression (6).

Constant numbers a and b are determined using the experiments in FIG. 11 and the like, the simulation data, and expression (6).

The curve determined with expression (6) is made to be tangent to the three points of the experiment data curve without going below them with tc=0.2 mm in FIG. 11, which results in a=2.00×10$^{-3}$, b=0.173.

$$tm \geq 2.00 \times 10^{-3} \times L^2 + 0.173 \quad \text{expression (7)}$$

This expression (7) corresponds to the curve of approximate expression (1) in FIG. 11.

Through FIG. 11 it is understood that the relationship between the thickness of die pad 10, which includes Cu, and length L of nitride semiconductor chip 6 is tm≥2.00×10$^{-3}$×L$^2$+0.173 in the case of L≥3.12 mm is the boundary condition in which cracks do not occur.

It is also understood that the occurrence of cracks can be limited when the die pad thickness is in the area above this curve (i.e., toward the positive end of the vertical axis in FIG. 11).

In FIG. 11, when tc>0.2 mm, thickness tc of the chip is also included in the calculation parameters since this might be insufficient under the conditions of expression (7). In other words, the results in FIG. 8B are used to insert thickness tc of nitride semiconductor chip 6 in the function of expression (7). In other words, the correlation between von Mises stress F and thickness tc is as follows when thickness tc is between 0.200 mm and 0.377 mm.

$$F = -890tc^2 + 670tc + 11.3$$

When this expression is inserted into expression (7), the following expression is obtained.

$$tm \geq 2.00 \times 10^{-3} \times L^2 + 0.173 + (-890 \times tc^2 + 670 \times tc - 98.4) / 593$$

In this expression, when a value of tc=0.25 or 0.35 is used, approximate expression (2) and approximate expression (3) are respectively obtained. It can be said that the occurrence of cracks can be limited with certainty when the die pad thickness is in the area above these curves (i.e., toward the positive end of the vertical axis in FIG. 11). Note that the thickness of the epilayer has a value of 4 μm in the simulations and experiments. Since cracks occur more easily as the thickness of the epilayer is greater, the relationship between thickness tm of the die pad and length L of the nitride semiconductor chip must satisfy expression (7) when the thickness of the GaN-epilayer is at least zipm in order to limit the occurrence of cracks.

A relationship between a yield rate and thickness tc of nitride semiconductor chip 6 will be described next.

Figure 13:
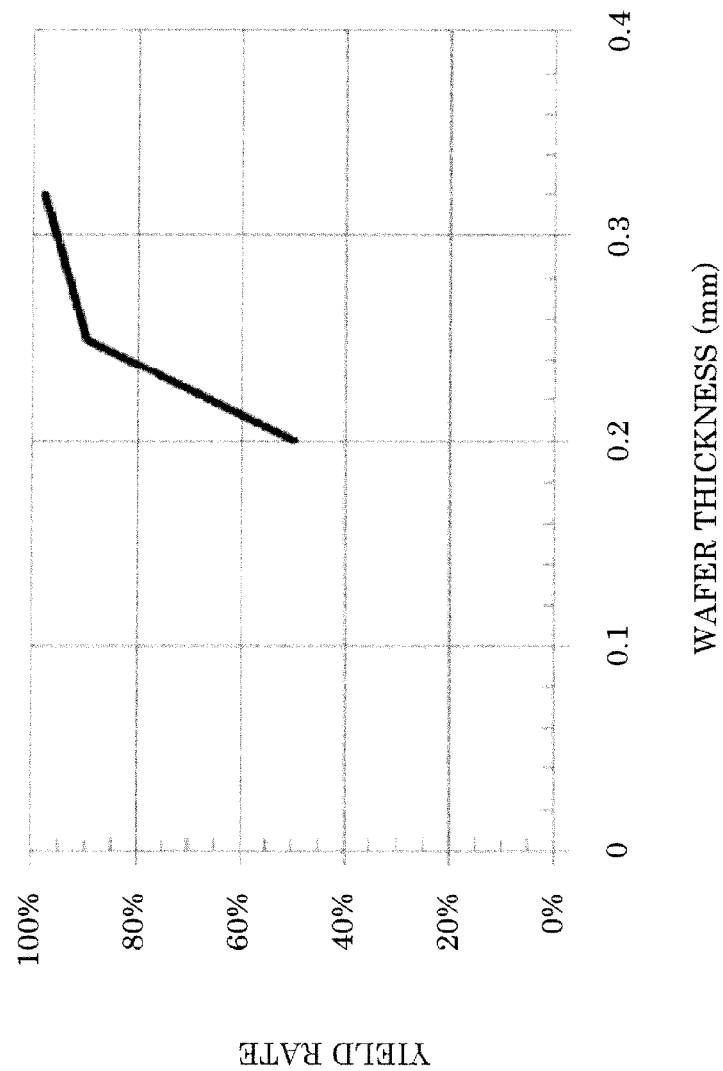
FIG. 13 is a graph showing a correlation between the thickness of the nitride semiconductor chip and a process yield of the backgrinding.

FIG. 13 is a graph showing a correlation between a wafer thickness (i.e., thickness tc of nitride semiconductor chip 6) and a process yield of the backgrinding.

For manufacturing nitride semiconductor chip 6, the wafer is made thinner by backgrinding the rear side thereof in order to reduce the thermal resistance after the nitride semiconductor power device has been formed on the wafer. When changing the wafer thickness, which is the thickness of the final nitride semiconductor chip 6, and examining the process yield of the backgrinding, the result as shown in FIG. 13 is obtained.

It is understood through FIG. 13 that the process yield of the backgrinding being less than 90% is due to cracks when thickness tc of nitride semiconductor chip 6 is less than 0.250 mm.

The yield can, therefore, be increased when the thickness of the nitride semiconductor chip is at least 0.250 mm.

To explain more specifically about thickness tc of nitride semiconductor chip 6, in the context of lowering the stress in semiconductor device 1, the thickness of silicon substrate 2 of nitride semiconductor chip 6 may be as small as possible.

However, when nitride semiconductor chip 6 is, for example, made thinner to approximately 0.2 mm, nitride semiconductor chip 6 warps protruding downward even more. It is then that silicon substrate 2 may rupture due to the tensile stress exceeding the permissible stress caused by the backgrinding. The thickness of the nitride semiconductor chip is, therefore, preferably at least 0.25 mm.

In the context of the heat dissipation, silicon substrate 2 may be as thin as possible since the thermal conductivity of silicon substrate 2 of nitride semiconductor chip 6 is lower than the thermal conductivity of the Cu-substrate die pad 10.

However, when silicon substrate 2 of nitride semiconductor chip 6 is, for example, is made thicker to 0.35 mm or more, the nitride semiconductor (InGaAlN layer 4) will become weaker due to the stress and the temperature will need to be higher due to the influence of the thermal resistance. The thickness of nitride semiconductor chip 6 is, therefore, preferably at most 0.35 mm.

The melting point of the solder used as adhesive 8 will be described next. The melting point of adhesive 8 is higher than the melting point of the adhesive used for the secondary mounting for mounting semiconductor device 1 on the printed board, and is, for example, at least 260° C. and at most 330° C.

Figure 14:
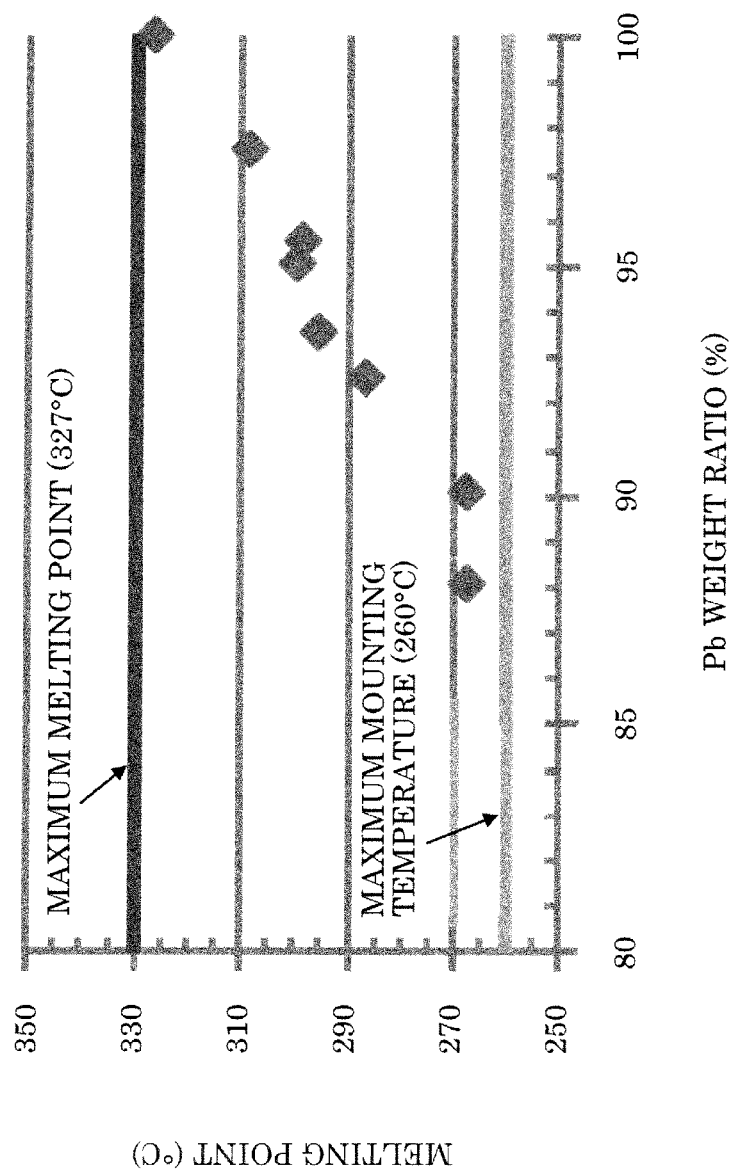
FIG. 14 is a graph showing a correlation between a lead (Pb) weight ratio and a melting point of Pb-solder.

FIG. 14 is a graph showing a correlation between the Pb-weight ratio and the melting point of the Pb-solder. According to FIG. 14, for nitride semiconductor chip 6, for example, the Pb-solder is bonded as adhesive 8. The solder, which bonds nitride semiconductor chip 6 and the Cu-substrate die pad 10, is made of a material that includes Pb with a melting point of at least 260° C., keeping in mind the secondary mounting of semiconductor device 1, such as lead-tin solder (95Pb5Sn) with a melting point of approximately 314° C. Nitride semiconductor chip 6 is a nitride semiconductor including InGaAlN layer 4 disposed on silicon substrate 2 with a thickness of at least 0.25 mm. Lead solder is suitable when joining nitride semiconductor chip 6 to the Cu-substrate die pad 10.

The low melting point of the lead solder, favorable wettability (fluidity, adaptability), and joint strength are superior to those of other adhesives, e.g. gold solder.

The maximum melting point of the lead solder is 327° C.

Nitride semiconductor chip 6 and the Cu-substrate die pad 10 are, for example, exposed to a temperature during the mounting that is higher than or equal to the melting point of the lead-tin solder (95Pb5Sn), e.g. 360° C. to 370° C.

Subsequently, temperature difference $\Delta T$ is produced when returning to room temperature from the melting point of the solder.

Since the thermal expansion coefficient of silicon substrate 2 of nitride semiconductor chip 6 is lower than the thermal expansion coefficient of the Cu-substrate die pad 10, the contraction of silicon substrate 2 of nitride semiconductor chip 6 is smaller than the contraction of the Cu-substrate. As a result, the nitride semiconductor chip warps protruding upward due to the difference in contraction between silicon substrate 2 of nitride semiconductor chip 6 and the Cu-substrate die pad 10 including.

Nitride semiconductor chip 6 and die pad 10 are, for example, exposed to a temperature of, for example, 370° C. to 380° C. when being mounted using a gold-silicon (AuSi) solder with a melting point of approximately 363° C.

Subsequently, temperature difference $\Delta T$ is produced when returning to room temperature from the melting point of the solder. Temperature difference $\Delta T$ becomes larger when the melting point of the solder is high, and the difference between the contraction of the silicon substrate of the nitride semiconductor chip and the contraction of the Cu-substrate die pad becomes even greater.

Nitride semiconductor chip 6 warps protruding upward even more.

The tensile stress on the top surface of the nitride semiconductor, therefore, becomes larger which poses a risk of cracks occurring in the nitride semiconductor. From this point of view, the melting point of the solder may be as low as possible.

Figure 15:
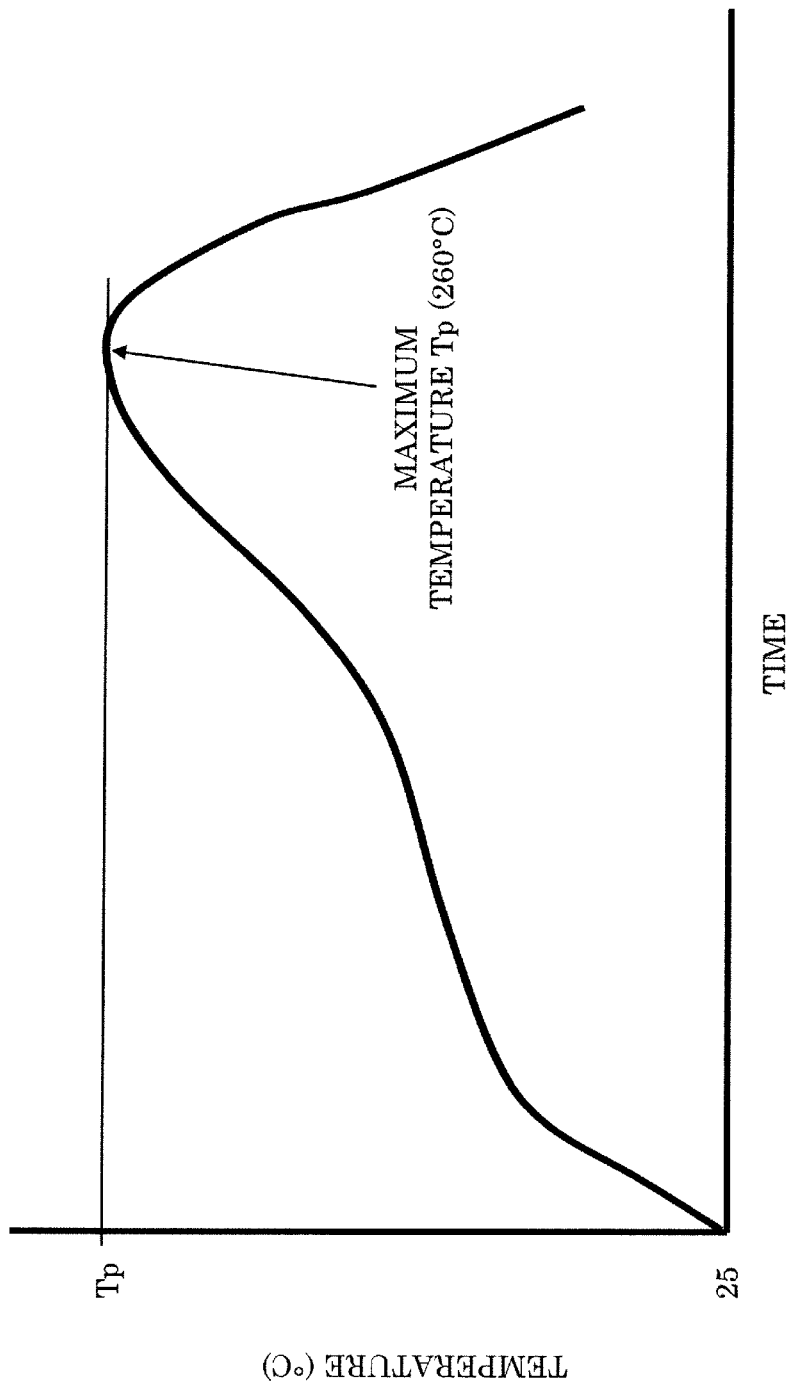
FIG. 15 is a graph showing a standard thermal profile of a secondary mounting.

FIG. 15 is a graph showing a standard thermal profile of the secondary mounting. Through FIG. 15, it can be understood that the maximum temperature during the secondary mounting reaches 260° C. Therefore, the Pb-solder inside semiconductor device 1 preferably has a melting point of least 260° C. so that the solder does not remelt, such as the lead-tin solder (95Pb5Sn) with a melting point of approximately 314° C.

Warping protruding downward occurs when thickness tp of resin 9 is too great even during the resin sealing after the die bonding (i.e., after nitride semiconductor chip 6 is joined to die pad 10). Processing defects may occur during the package dicing because of this. During the experiments performed by the inventors, processing defects due to the warping did not occur when the package thickness (i.e., thickness of resin 9) tp=1.2 mm, in the case of the die pad thickness tm=0.4 mm. tm/tp≥33% is therefore preferable.

A method for manufacturing semiconductor device 1 will be described next.

Figure 16:
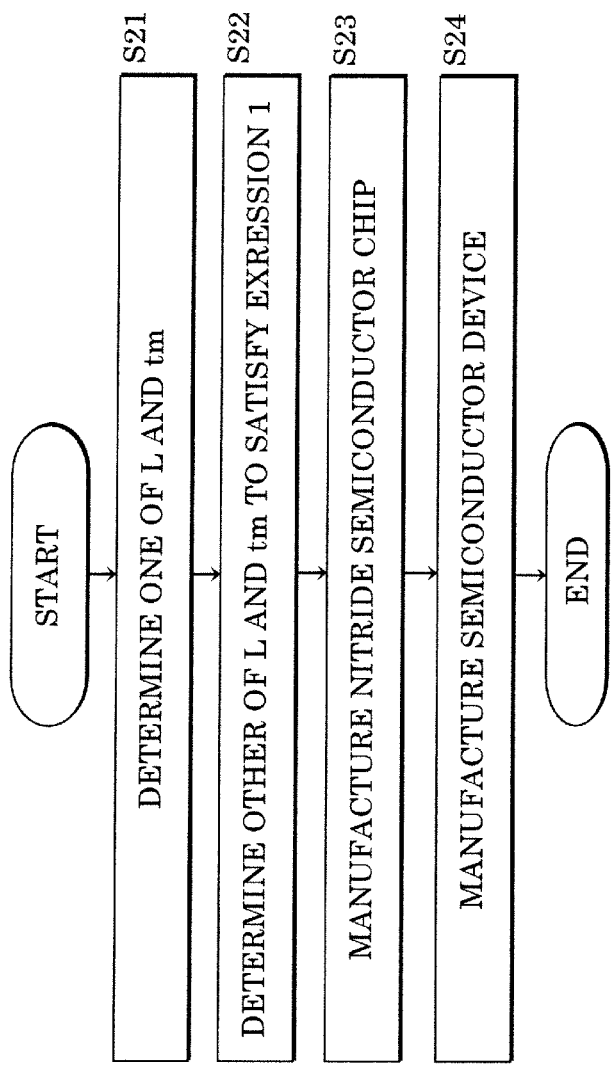
FIG. 16 is a flowchart of an example of a method for manufacturing the semiconductor device in Embodiment 1.
Figure 17:
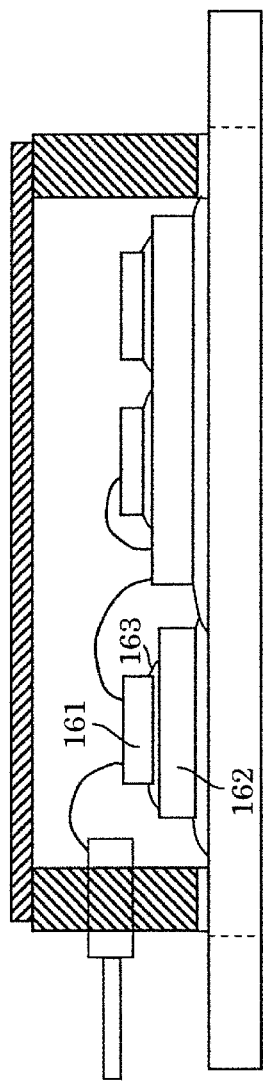
FIG. 17 is a diagram schematically showing a cross-section structure of a conventional nitride semiconductor device.

FIG. 16 is a flowchart of an example of the method for manufacturing semiconductor device 1 in the embodiment. In the drawing, a size of one of length L (mm) of nitride semiconductor chip 6 and thickness tm (mm) of die pad 10 is first determined (S21), and then a size of the other of length L and thickness tm is determined within the range of the expression tm≥a×L$^2$+b (S22). a and b are both constant numbers besides zero. For example, a may be 2.00×10$^{-3}$ and b may be 0.173.

Nitride semiconductor chip 6 is manufactured according to the determined length L and thickness tm (S23), and then semiconductor device 1 is manufactured through the bonding of nitride semiconductor chip 6 and die pad 10, wire bonding, resin sealing, and the like.

Note that for steps S21 and S22, the design method during the design stage of semiconductor device 1 may also be one process.

This makes it possible to limit the occurrence of cracks in nitride semiconductor chip 6.

As described above, semiconductor device 1 that is a surface mount-type device in the present disclosure includes nitride semiconductor chip 6 having a thickness of at least 0.2 mm and including silicon substrate 2 having a first thermal expansion coefficient and $In_xGa_yAl_{1-x-y}N$ layer 4 in contact with a surface of silicon substrate 2, where 0≤x≤1, 0≤y≤1, 0≤x+y≤1; die pad 10 including Cu and having a second thermal expansion coefficient that is greater than the first thermal expansion coefficient; and adhesive 8 that joins a backside of nitride semiconductor chip 6 and die pad 10. The thickness of the nitride semiconductor chip is at least 0.2 mm, length L of nitride semiconductor chip 6 is at least 3.12 mm and thickness tm of die pad 10 and length L of nitride semiconductor chip 6 satisfy tm≥2.00×10$^{-3}$×L$^2$+ 0.173, tm being a thickness in mm and L being a length in mm.

This makes it possible to limit the occurrence of cracks in nitride semiconductor chip 6.

Semiconductor device 1 is a rectangular package having terminals 11 including gate terminal 11g, source terminals 11s, and drain terminals 11d, and out of terminals 11, all terminals disposed at the second side may be are separated from die pad 10.

Semiconductor device is a rectangular package having terminals 11 including gate terminal 11g, source terminals 11s, and drain terminals 11d, and source terminals 11s and drain terminals 11d are disposed respectively at two opposed sides of the rectangular package.

This facilitates maintaining the pressure resistance between the drain and the source.

Out of two opposed main surfaces of die pad 10, the main surface not joined to nitride semiconductor chip 6 may be exposed from semiconductor device 1.

This makes it possible to facilitate heat dissipation to an exterior of die pad 10.

The first side and the second side may have an equal number of terminals.

This makes it possible to limit mounting bias and the like of semiconductor device 1 during the secondary mounting at the first side and the second side.

Terminals 11 may be substantially flush with a lateral surface of the rectangular package.

This makes it possible to keep the mounting surface of semiconductor device 1 during the secondary mounting at an absolute minimum.

Thickness tc of the nitride semiconductor chip is at least 0.200 mm and at most 0.377 mm, and thickness tm, length L, and thickness tc may satisfy $tm \geq 2.00 \times 10^{-3} \times L^2 + 0.173 + (-890 \times tc^2 + 670 \times tc - 98.4)/593$.

This makes it possible to limit the occurrence of cracks with more certainty even when thickness tc of nitride semiconductor chip 6 is larger than 0.200 mm.

The thickness of nitride semiconductor chip 6 may be at least 0.25 mm.

This makes it possible to increase the process yield of the backgrinding of nitride semiconductor chip 6 during the wafer stage.

Adhesive 8 may include solder containing lead.

The melting point of adhesive 8 may be higher than the melting point of a secondary mounting adhesive for mounting semiconductor device 1 on a printed circuit board.

The melting point of adhesive 8 may be at least 260° C. and at most 330° C.

This makes it possible to reduce warping during the second stage. The mounting can be performed more reliably since adhesive 8 does not melt during the secondary mounting.

A method for manufacturing semiconductor device 1 including (i) nitride semiconductor chip 6 having a thickness of at least 0.2 mm and including silicon substrate 2 having a first thermal expansion coefficient and $In_xGa_yAl_{1-x-y}N$ layer 4 in contact with a surface of silicon substrate 2, where $0 \leq x \leq 1$, $0 \leq y \leq 1$, $0 \leq x+y \leq 1$, and (ii) die pad 10 including Cu and having a second thermal expansion coefficient that is greater than the first thermal expansion coefficient, and (iii) adhesive 8 that joins a backside of nitride semiconductor chip 6 and die pad 10 in the present disclosure includes determining a size of one of length L of nitride semiconductor chip 6 and thickness tm of die pad 10, L being a length in mm and tm being a thickness in mm; and determining a size of the other of length L and thickness tm that satisfies $tm \geq 2.00 \times 10^{-3} \times L^2 + 0.173$, L being at least 3.12 mm.

This makes it possible to limit the occurrence of cracks in nitride semiconductor chip 6.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can provide a nitride semiconductor device in which warping of a nitride semiconductor chip and stress is limited. Since a nitride semiconductor device with superior heat dissipation and high reliability can be provided, the nitride semiconductor device in the present disclosure is useful.

What is claimed is:

1. A semiconductor device that is a surface mount-type device, the semiconductor device comprising:
    a nitride semiconductor chip including a silicon substrate having a first thermal expansion coefficient and an $In_xGa_yAl_{1-x-y}N$ layer in contact with a surface of the silicon substrate, where $0 \leq x \leq 1$, $0 \leq y \leq 1$, $0 \leq x+y \leq 1$;
    a die pad including Cu and having a second thermal expansion coefficient that is greater than the first thermal expansion coefficient; and
    an adhesive that joins a backside of the nitride semiconductor chip and the die pad, wherein:
    a thickness of the nitride semiconductor chip is at least 0.2 mm,
    thickness tm of the die pad and length L of the nitride semiconductor chip satisfy $tm \geq 2.00 \times 10^{-3} \times L^2 + 0.173$, tm being a thickness in mm and L being a length in mm,
    the semiconductor device is a rectangular package having a plurality of terminals including a gate terminal, a source terminal, and a drain terminal,
    the source terminal and the drain terminal are disposed respectively at two opposed sides of the rectangular package,
    the source terminal and the drain terminal are provided separately from the die pad and connected to the nitride semiconductor chip with bonding wires, and
    the thickness tm of the die pad is equal to a thickness of the plurality of terminals.

2. The semiconductor device according to claim 1, wherein:
    the plurality of terminals are dispersed at a first side and a second side that are two opposed sides in a plan view of the semiconductor device,
    the first side has the gate terminal, and
    out of the plurality of terminals, all terminals disposed at the second side are separated from the die pad.

3. The semiconductor device according to claim 1, wherein
    out of two opposed main surfaces of the die pad, the main surface not joined to the nitride semiconductor chip is exposed from the semiconductor device.

4. The semiconductor device according to claim 2, wherein
    the two opposed sides have an equal number of terminals.

5. The semiconductor device according to claim 1, wherein
    a first side and a second side have an equal number of terminals, the first side and the second side being the two opposed sides.

6. The semiconductor device according to claim 1, wherein
    the plurality of terminals are substantially flush with a lateral surface of the rectangular package.

7. The semiconductor device according to claim 1, wherein
    the plurality of terminals are substantially flush with a lateral surface of the rectangular package.

8. The semiconductor device according to claim 4, wherein
    a plurality of terminals are substantially flush with a lateral surface of a rectangular package.

9. The semiconductor device according to claim 1, wherein
    thickness tc of the nitride semiconductor chip is at least 0.200 mm and at most 0.377 mm, and
    thickness tm, length L, and thickness tc satisfy $tm \geq 2.00 \times 10^{-3} \times L^2 + 0.173 + (-890 \times tc^2 + 670 \times tc - 98.4)/593$.

10. The semiconductor device according to claim 1, wherein
    a thickness of the nitride semiconductor chip is at least 0.25 mm.

11. The semiconductor device according to claim 1, wherein the adhesive includes solder containing lead.

12. The semiconductor device according to claim 8, wherein a melting point of the adhesive is higher than a melting point of a secondary mounting adhesive for mounting the semiconductor device on a printed circuit board.

13. The semiconductor device according to claim 1, wherein the adhesive has a melting point of at least 260° C. and at most 330° C.

14. The semiconductor device according to claim 1 wherein
   a level of an upper surface of the die pad is equal to a level of upper surfaces of the plurality of terminals.

15. The semiconductor device according to claim 1, wherein length L of the nitride semiconductor chip is at least 3.12 mm.

16. The semiconductor device according to claim 1, wherein the thickness tm of the die pad is greater the thickness of the nitride semiconductor chip.

17. The semiconductor device according to claim 10, wherein length L of the nitride semiconductor chip is at least 3.12 mm.

\* \* \* \* \*